(12) United States Patent
Okami (10) Patent No.: US 11,352,697 B2
(45) Date of Patent: Jun. 7, 2022

(54) APPARATUS FOR PROCESSING LONG BASE MATERIAL BY ROLL-TO-ROLL METHOD AND FILM FORMING APPARATUS USING THE SAME

(71) Applicant: SUMITOMO METAL MINING CO., LTD., Tokyo (JP)

(72) Inventor: Hideharu Okami, Niihama (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 330 days.

(21) Appl. No.: 15/684,030

(22) Filed: Aug. 23, 2017

(65) Prior Publication Data
US 2018/0066362 A1    Mar. 8, 2018

(30) Foreign Application Priority Data
Aug. 23, 2016 (JP) .............................. JP2016-162786

(51) Int. Cl.
*C23C 14/34* (2006.01)
*C23C 14/56* (2006.01)
(Continued)

(52) U.S. Cl.
CPC ...... *C23C 16/45534* (2013.01); *C23C 14/021* (2013.01); *C23C 14/025* (2013.01);
(Continued)

(58) Field of Classification Search
None
See application file for complete search history.

(56) References Cited

U.S. PATENT DOCUMENTS

| 3,498,259 | A | 3/1970 | Braguier |
| 2005/0249875 | A1* | 11/2005 | Sasaki .................. C23C 14/562 |
| | | | 427/248.1 |

(Continued)

FOREIGN PATENT DOCUMENTS

| JP | 62-247073 A | 10/1987 |
| JP | 02-098994 A | 4/1990 |

(Continued)

OTHER PUBLICATIONS

Braguier M et al., "Machine a metalliser en continu sur deux faces ou sur une face les films dielectriques de tres faible epaisseur", Le Vide, vol. 22, No. 131, Sep. 1, 1967, pp. 280-287. (cited in the Dec. 22, 2017 EP Search Report).

(Continued)

*Primary Examiner* — Karla A Moore
(74) *Attorney, Agent, or Firm* — Locke Lord LLP (57) ABSTRACT

A treatment apparatus includes two can rolls provided on a transfer path through which a long resin film is transferred in a roll-to-roll manner in a vacuum chamber; and surface treatment means facing an outer circumference of each of the can rolls to treat a surface of the long resin film cooled by being wound around the outer circumference. The downstream can roll is provided with upper and lower two sets of feeding and sending systems, and one surface of the long resin film in contact with the outer circumference of the downstream can roll at a time when the long resin film travels through the lower one of the two sets of feeding and sending systems is opposite to the other surface of the resin film in contact with the outer circumference of the downstream can roll at a time when the resin film travels through the upper one.

9 Claims, 3 Drawing Sheets

(51) Int. Cl.
  *C23C 16/455* (2006.01)
  *C23C 14/35* (2006.01)
  *C23C 14/02* (2006.01)
  *H01J 37/32* (2006.01)
  *C23C 14/20* (2006.01)
  *G11B 5/85* (2006.01)
  *C23C 14/16* (2006.01)

(52) U.S. Cl.
  CPC ........ *C23C 14/205* (2013.01); *C23C 14/3407* (2013.01); *C23C 14/35* (2013.01); *C23C 14/562* (2013.01); *G11B 5/85* (2013.01); *H01J 37/3277* (2013.01); *B65H 2301/51145* (2013.01); *C23C 14/165* (2013.01); *C23C 14/568* (2013.01)

(56) References Cited

U.S. PATENT DOCUMENTS

| | | |
|---|---|---|
| 2010/0242842 A1 | 9/2010 | Takeuchi et al. |
| 2013/0029162 A1* | 1/2013 | Nas .............. C23C 14/562 |
| | | 428/457 |
| 2013/0216728 A1 | 8/2013 | Hurren et al. |

FOREIGN PATENT DOCUMENTS

| | | |
|---|---|---|
| JP | 3447070 B2 | 9/2003 |
| JP | 2013-049914 A | 3/2013 |
| JP | 2013-049915 A | 3/2013 |
| JP | 2013-049916 A | 3/2013 |
| WO | 2004/059032 A1 | 7/2004 |

OTHER PUBLICATIONS

Search Report dated Dec. 22, 2017, issued for the European patent application No. 17187495.1.
Office Action dated Mar. 31, 2020, issued for the Japanese Patent Application No. 2016-162786.

* cited by examiner

APPARATUS FOR PROCESSING LONG BASE MATERIAL BY ROLL-TO-ROLL METHOD AND FILM FORMING APPARATUS USING THE SAME

TECHNICAL FIELD

The present invention relates to a treatment apparatus capable of continuously performs treatment of the surface of a long base material while transferring the long base material in a roll-to-roll manner, and a deposition apparatus using the same. More particularly, the present invention relates to a roll-to-roll type treatment apparatus for a long base material, which includes two or more can rolls around which a long base material transferred in a roll-to-roll manner in a vacuum chamber is to be wound for cooling, and which can change part of the transfer path of a long base material to select either one case which performs treatment of both surfaces of the long base material or the other case which performs treatment of only one surface of the long base material, and a deposition apparatus using the same.

BACKGROUND ART

In an electronic device such as a liquid crystal panel, a notebook computer, a digital camera, or a mobile phone, a flexible wiring substrate is used which has a resin film and a wire circuit formed thereon. This flexible wiring substrate can be produced by patterning a metal film of a metal film-coated resin film, which is obtained by forming a metal film on one or both of surfaces of a resin film, by thin-film technology such as photolithography or etching. In recent years, wire circuit patterns of flexible wiring substrates have been increasingly miniaturized and densified, and therefore there has been demand for flat and wrinkle-free metal film-coated resin films.

Several methods for producing such a metal film-coated resin film are known, these methods include a method in which metal foils are bonded to a resin film with an adhesive (method for producing a three-layer substrate), a method in which a metal foil is coated with a resin solution and then the resin solution is dried (casting method), and a method in which a metal film is formed on a resin film by a vacuum deposition method alone or a combination of a vacuum deposition method and a wet plating method (metallization method).

Among the above production methods, examples of the vacuum deposition method used for metallization include a vacuum vapor deposition method, a sputtering method, an ion plating method, and an ion beam sputtering method. For example, as a sputtering method, Patent Literature 1 discloses a method in which a chromium layer is sputtered on a polyimide insulating layer, and then a conductive layer is formed by sputtering copper. Further, Patent Literature 2 discloses a material for flexible circuit board in which a first metal thin film formed by sputtering using a copper-nickel alloy as a target and a second metal thin film formed by sputtering using copper as a target are laminated in this order on a polyimide film.

Meanwhile, when a metal film is continuously and efficiently formed on a resin film such as a polyimide film by a vacuum deposition method, a roll-to-roll type vacuum deposition apparatus, which is also called a sputtering web coater, is generally used in which vacuum deposition is continuously performed on a long resin film transferred from an unwinding roll to a winding roll in a roll-to-roll manner in a vacuum chamber while the resin film is cooled by being wound around the outer circumference of a can roll provided on the transfer path of the long resin film.

When deposition is performed on both surfaces of a long resin film by such a vacuum deposition apparatus, the long resin film is first transferred in one direction from the unwinding roll to the winding roll to perform deposition on only one surface thereof, the long resin film having a deposited layer formed on only one surface thereof is then unloaded from the winding roll and loaded on the unwinding roll, and the long resin film is again transferred in one direction from the unwinding roll to the winding roll to perform deposition on another surface thereof. However, this method is poor in production efficiency because the inside of the vacuum chamber needs to be once exposed to the atmosphere after deposition is performed on one surface of the resin film. Therefore, Patent Literatures 4, 5, and 6 propose to perform deposition using a deposition apparatus having two can rolls, in which case deposition can be continuously performed on both front and back surfaces of a resin film by transferring the resin film only once in one direction from an unwinding roll to a winding roll.

PRIOR TECHNICAL LITERATURE

Patent Literature

[Patent Literature 1] JP 2-98994 A
[Patent Literature 2] JP 3447070 B2
[Patent Literature 3] JP 62-247073 A
[Patent Literature 4] JP 2013-049914 A
[Patent Literature 5] JP 2013-049915 A
[Patent Literature 6] JP 2013-049916 A

SUMMARY OF THE INVENTION

Problems to be Solved by the Invention

The vacuum deposition apparatuses having two can rolls disclosed in Patent Literatures 4, 5, and 6 can select either a path in which a resin film is wound around the outer circumference of a downstream can roll in a clockwise manner or a path in which a resin film is wound around the can roll in a counterclockwise manner. This makes it possible to perform deposition on either both surfaces or only one surface of a long base material by transferring the long base material only once in one direction in a roll-to-roll manner.

However, in the vacuum deposition apparatuses disclosed in Patent Literatures 4, 5, and 6, one of the two can rolls that is provided on the two transfer paths requires two sets of winding systems or unwinding systems, and therefore a winding system or an unwinding system needs to be provided also between the two can rolls in addition to a winding system and an unwinding system provided at one end and another end of the vacuum deposition apparatus, respectively. Further, one of the two can rolls provided on the two transfer paths requires a long path provided over or under the can roll so as to cross the can roll.

Such a long path that crosses the can roll and such a winding system or unwinding system located between the two can rolls increase the size of a vacuum chamber and deteriorate workability at the time of loading or unloading of a resin film or maintenance. In view of such a problem of a conventional roll-to-roll type vacuum deposition apparatus having two or more can rolls, it is an object of the present invention to provide a roll-to-roll type treatment apparatus capable of selecting either a path for double-side treatment or a path for single-side treatment without increasing the size thereof.

Means For Solving The Problem

In order to achieve the above object, the present inventor has intensively studied, and as a result has found that the size of a vacuum deposition apparatus can be reduced by providing, on each of the upper and lower sides of one of two can rolls, one set of a transfer system that feeds and sends a long resin film to and from the outer circumference of the can roll in such a manner that the transfer systems are symmetry with respect to a horizontal plane having thereon the rotation axis of the can roll. This finding has led to the completion of the present invention.

More specifically, the present invention is directed to a roll-to-roll treatment apparatus including: at least two can rolls provided on a transfer path through which a long base material is to be transferred from an unwinding roll to a winding roll in a roll-to-roll manner in a vacuum chamber; and surface treatment means facing an outer circumference of each of the can rolls to treat a surface of the long base material cooled by being wound around the outer circumference, wherein at least one of the at least two can rolls is provided with two sets of feeding and sending systems having a function of winding the long base material around the outer circumference of the can roll, and one surface of the long base material in contact with the outer circumference of the corresponding can roll at a time when the long base material travels through one of the two sets of feeding and sending systems is opposite to the other surface of the long base material in contact with the outer circumference of the corresponding can roll at a time when the long base material travels through the other set of feeding and sending system.

Effect of the Invention

According to the present invention, it is not necessary to provide a winding system or an unwinding system between two can rolls and a long path that crosses a can roll, which makes it possible to provide a compact treatment apparatus and to improve workability, i.e. replacement of a long base material, of the treatment apparatus.

DESCRIPTION OF THE EMBODIMENTS

Hereinbelow, referring to FIG. 1, a vacuum deposition apparatus that continuously performs dry deposition on a long base material will be described as one specific example of a roll-to-roll type treatment apparatus for a long base material according to the present invention. The vacuum deposition apparatus shown in FIG. 1, also called a sputtering web coater, can continuously perform sputtering deposition that applies a thermal load on the surface of a long resin film F as a long base material transferred in a roll-to-roll manner, while the long resin film F is cooled from the back surface side thereof by being wound around the outer circumference of a can roll. This vacuum deposition apparatus is suitably used to continuously and efficiently perform a deposition process on the surface of a long base material.

Figure 1:
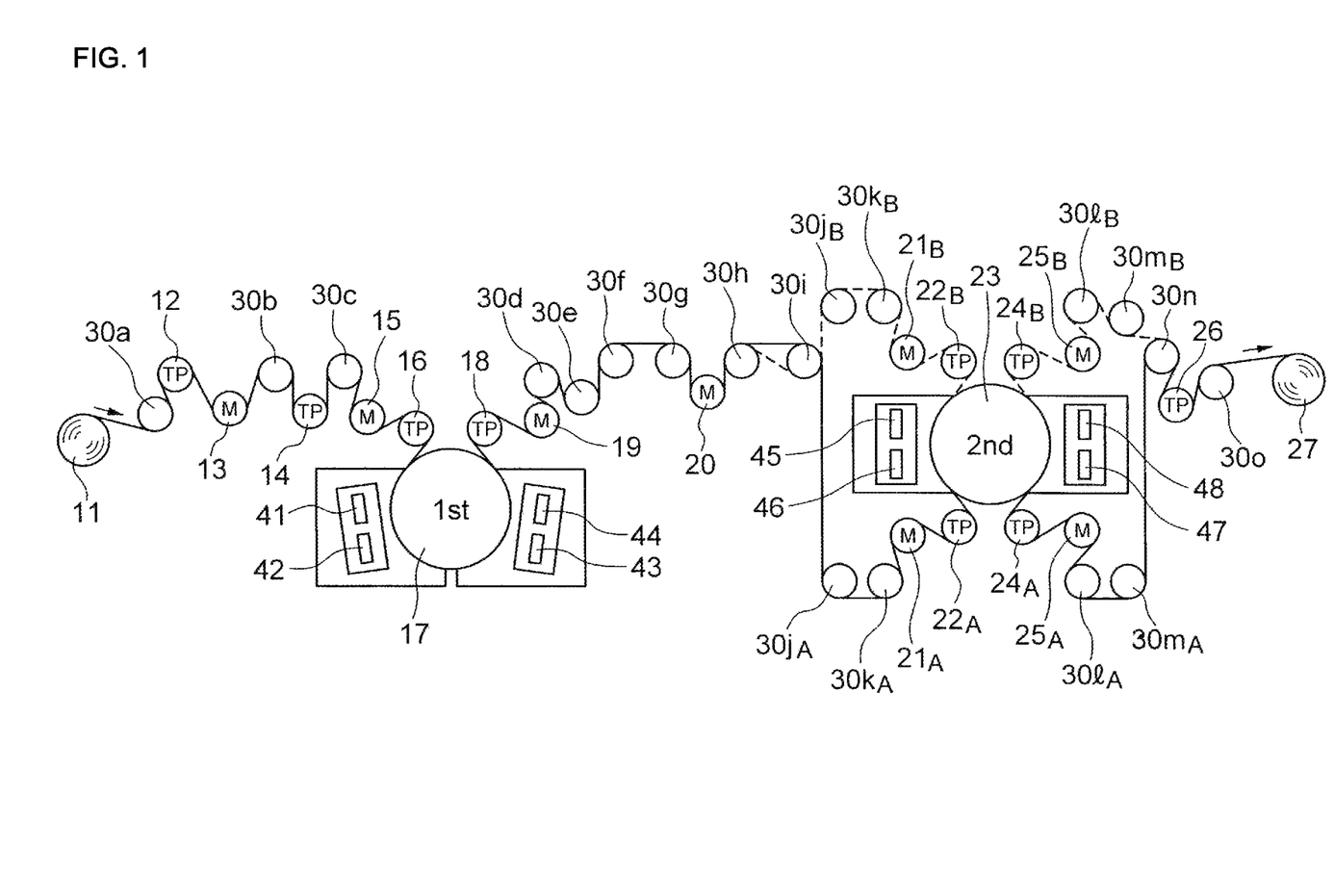
FIG. 1 A front view of a roll-to-roll type vacuum deposition apparatus as one specific example of the present invention which is capable of selecting either a path for double-side deposition or a path for single-side deposition.

The vacuum deposition apparatus shown in FIG. 1 is provided in a vacuum chamber (not shown) which is equipped with various vacuum devices such as a dry pump, a turbomolecular pump, and a cryocoil. When sputtering deposition is performed, the pressure in the vacuum chamber is reduced to an achieving pressure of about $10^{-4}$ Pa by these vacuum devices, and then can be adjusted to about 0.1 to 10 Pa by introducing a sputtering gas. As the sputtering gas, a known gas such as argon is used, and a gas such as oxygen is further added depending on the purpose. The shape and material of the vacuum chamber are not particularly limited, and various vacuum chambers can be used as long as they can withstand such reduced pressure conditions.

In this vacuum chamber, various roll groups that define a roll-to-roll transfer path of the long resin film F and deposition means that perform a deposition process on the long resin film F are provided. These various roll groups include a pair of an unwinding roll 11 and a winding roll 27, motor-driven first can roll 17 (indicated as 1st) and second can roll 23 (indicated as 2nd) around which the long resin film F unwound from the unwinding roll 11 is to be wound for cooling, tension sensor rolls (indicated as TP), motor-driven rolls (indicated as M), and other free rolls. It is to be noted that all the rotation axes of the roll groups extend in a horizontal direction, and therefore the width direction of the long resin film F is always kept substantially horizontal when the long resin film F is transferred in a roll-to-roll manner.

In the above-described roll-to-roll transfer path, a path in which the long resin film F is wound around the outer circumference of the second can roll 23 to perform deposition can be selected from either a path in which the long resin film F is wound around the outer circumference in a clockwise manner or a path in which the long resin film F is wound around the outer circumference in a counterclockwise manner. This makes it possible to select either an operation mode in which deposition is performed on both surfaces of the long resin film F by transferring the long resin film F in only one direction in a roll-to-roll manner or an operation mode in which deposition is performed on only one surface of the long resin film F. More specifically, when a path A indicated by a solid line and located on the lower side of the second can roll 23 is selected, surface treatment can be performed on both surfaces of the long resin film F by transferring the long resin film F in only one direction in a roll-to-roll manner, and when a path B indicated by a broken line and located on the upper side of the second can roll 23 is selected, surface treatment can be performed on only one surface of the long resin film F by transferring the long resin film F in only one direction in a roll-to-roll manner.

The roll-to-roll transfer path defined by the various roll groups will be specifically described. In a first half path in which the long resin film F is wound around the outer circumference of the first can roll 17 to perform deposition, the long resin film F unwound from the unwinding roll 11 is passed through a free roll 30a, a first tension sensor roll 12, a first driving roll 13, a free roll 30b, a second tension sensor roll 14, a free roll 30c, a first feeding roll 15, and a first feeding tension sensor roll 16 in this order and fed to the first can roll 17 so that a deposition process is performed by deposition means, which will be described later, on the long resin film F transferred along the outer circumference of the first can roll 17, and then the long resin film F is sent from the outer circumference of the first can roll 17 through a first sending tension sensor roll 18 by a first sending roll 19.

The first tension sensor roll 12 measures the tension of the long resin film F just after unwinding from the unwinding roll 11. Based on this measured value, AC servomotors for rotary-driving the unwinding roll 11 and the first driving roll 13, which are respectively located just upstream and downstream from the first tension sensor roll 12, are subjected to, for example, torque control or speed control. As a result, the long resin film F is unwound from the unwinding roll 11 while the tension thereof is maintained at a predetermined preset value.

Further, the feeding tension sensor roll 16 provided just upstream from the first can roll 17 measures the tension of the long resin film F to be fed to the first can roll 17. Based on this measured value, the difference between the circumferential speeds of the motor-driven first feeding roll 15 and first can roll 17, which are respectively located just upstream and downstream from the feeding tension sensor roll 16, is adjusted by speed control or the like. Similarly, the first sending tension sensor roll 18 provided just downstream from the first can roll 17 measures the tension of the long resin film F sent from the first can roll 17. Based on this measured value, the difference between the circumferential speeds of the motor-driven first can roll 17 and first sending roll 19, which are respectively located just upstream and downstream from the first sending tension sensor roll 18, is adjusted by speed control or the like. A feeding and sending system constituted from the two driving rolls and the two tension sensor rolls located upstream and downstream from the first can roll 17 allows the long resin film F to stably come into close contact with the outer circumference of the first can roll 17.

The long resin film F sent from the sending roll 19 is sent to a second half path in which the long resin film F is wound around the outer circumference of the second can roll 23 to perform deposition. In this second half path, the long resin film F is passed through free rolls 30d, 30e, 30f, 30g, and a central driving roll 20 located at almost the center of the roll-to-roll transfer path, then further passed through a free roll 30h, and fed to a branching free roll 30i that serves as a branching point of the path. By this branching free roll 30i, the long resin film F is sent to either the lower path A indicated by a solid line or the upper path B indicated by a broken line.

In the lower path A, the long resin film F is passed through free rolls $30j_A$ and $30k_A$ and then, similarly to the above-described feeding and sending system for the first can roll 17, fed to the second can roll 23 by a lower feeding roll $21_A$ and a lower feeding tension sensor roll $22_A$ so that a deposition process is performed by deposition means, which will be described later, on the long resin film F transferred along the outer circumference of the second can roll 23, and then the long resin film F is sent from the outer circumference of the second can roll 23 by a lower sending tension sensor roll $24_A$ and a lower sending roll $25_A$.

On the other hand, in the upper path B, the long resin film F is passed through free rolls $30j_B$ and $30k_B$ and then, similarly to the above-described feeding and sending system for the first can roll 17, fed to the second can roll 23 by an upper feeding roll $21_B$ and an upper feeding tension sensor roll $22_B$ so that a deposition process is performed by deposition means, which will be described later, on the long resin film F transferred along the outer circumference of the second can roll 23, and then the long resin film F is sent from the outer circumference of the second can roll 23 by an upper sending tension sensor roll $24_B$ and an upper sending roll $25_B$.

The lower feeding and sending system located on the lower side of the second can roll 23 is constituted from the lower feeding roll $21_A$, the lower feeding tension sensor roll $22_A$, the lower sending tension sensor roll $24_A$, and the lower sending roll $25_A$, and the upper feeding and sending system located on the upper side of the second can roll 23 is constituted from the upper feeding roll $21_B$, the upper feeding tension sensor roll $22_B$, the upper sending tension sensor roll $24_B$, and the upper sending roll $25_B$. The upper feeding and sending system and the lower feeding and sending system are provided on the upper and lower sides of a horizontal plane having thereon the rotation center axis of the second can roll 23, respectively so as to be symmetry with respect to the horizontal plane. Therefore, one surface of the long resin film F in contact with the outer circumference of the second can roll 23 at the time when the long resin film F travels through one of the two feeding and sending systems on the paths A and B is opposite to the other surface of the long resin film F in contact with the outer circumference of the second can roll 23 at the time when the long resin film F travels through another one.

Further, the feeding and sending system for the first can roll 17 is located on the upper side of a horizontal plane having thereon the center axis of the first can roll 17, and therefore the positional relationship of the feeding and sending system for the first can roll 17 to the horizontal plane is opposite to that of the feeding and sending system on the path A located on the lower side of the second can roll 23 to a horizontal plane having thereon the center axis of the second can roll 23, but is the same as that of the feeding and sending system on the path B located on the upper side of the second can roll 23 to the horizontal plane. That is, when the path A is selected, deposition can be performed on both surfaces of the long resin film F by transferring the long resin film F in only one direction in a roll-to-roll manner, and when the path B is selected, deposition can be performed on only one surface of the long resin film F.

Whichever of the paths A and B is selected, the long resin film F that has been subjected to a deposition process is wound up on the same winding roll 27. That is, the long resin film F that has been subjected to a deposition process through the path A and the long resin film F that has been subjected to a deposition process through the path B are passed through free rolls $30l_A$ and $30m_A$ and free rolls $30l_B$ and $30m_B$, respectively, and then passed through a free roll 30n, a pre-winding tension sensor roll 26, and a free roll 30o, which are common to the paths A and B, and wound up on the winding roll 27.

The vacuum deposition apparatus is versatile because, as described above, deposition can be performed on both surfaces or only one surface of a long resin film by selecting either the path A or B. Further, in the vacuum deposition apparatus, paths between adjacent rolls can be shortened, and a long path that crosses the second can roll 23 does not need to be provided. Further, a winding roll does not need to be provided between the two can rolls. Therefore, the vacuum deposition apparatus is excellent in workability and maintainability, and can avoid an increase in the size of a vacuum chamber.

In positions facing the outer circumference of the first can roll 17, first, second, third, and fourth magnetron sputtering cathodes 41, 42, 43, and 44 are provided in this order along the transfer path as dry deposition means. Similarly, in positions facing the outer circumference of the second can roll 23, fifth, sixth, seventh, and eighth magnetron sputtering cathodes 45, 46, 47, and 48 are provided in the same order as in the case of the first can roll 17 along the transfer path.

Therefore, the long resin film F transferred in a roll-to-roll manner can be cooled from the back surface side thereof when subjected to a deposition process that applies a thermal load, which makes it possible to produce a metal film-coated long resin film having few defects such as wrinkles. It is to be noted that when such a plate-like target as shown in FIG. 1 is used, there is a case where nodules occur (due to the growth of foreign matter) on the target. If this becomes a problem, a cylindrical rotary target is preferably used which does not generate nodules and is high in its use efficiency.

In order to perform a sputtering deposition process that applies a thermal load on the long resin film F, the vacuum deposition apparatus shown in FIG. 1 is provided with the magnetron sputtering cathodes 41 to 48 as described above. However, the process that applies a thermal load is not limited thereto, and an apparatus having another device for surface treatment such as CVD (chemical vapor deposition) or vacuum vapor deposition may be used. In this case, surface treatment means for such a device are provided instead of the plate-like targets. Further, instead of the long resin film F, a metal foil or a metal strip may be treated.

The above-described metal film-coated long resin film can be produced by, for example, laminating a film made of a Ni-based alloy or the like and a Cu film on the surface of the long resin film F. The metal film-coated resin film having such a laminated structure is formed into a flexible wiring substrate by patterning a metal film by a subtractive method. The subtractive method produces a flexible wiring substrate by removing a metal film (e.g., the above-described Cu film) not covered with a resist by etching.

The film made of a Ni alloy or the like is called a seed layer, and its composition is selected according to the desired characteristics of the metal film-coated resin film, such as electrical insulating properties and migration resistance. For example, various known alloys such as Ni—Cr alloys, Inconel, constantan, and Monel can be used. When the metal film (Cu film) of the metal film-coated long resin film produced by dry deposition needs to be further thickened, the thickness of the metal film may further be increased by a wet plating method. In this case, the metal film may be thickened by electroplating processing alone or a combination of electroless plating processing as primary plating and electrolytic plating processing as secondary plating. In either case, the wet plating method is not particularly limited, and a general wet plating method can be used.

Examples of a resin film that can be used for the metal film-coated resin film include polyimide-based films, polyamide-based films, polyester-based films, polytetrafluoroethylene-based films, polyphenylene sulfide-based films, polyethylene naphthalate-based films, and liquid crystal polymer-based films. Among them, polyethylene terephthalate (PET) films and polyimide films are preferred from the viewpoint of flexibility required of a metal film-coated flexible substrate, strength required for practical use, and electrical insulating properties suitable for a wiring material. It is to be noted that the above specific example has been described with reference to a case where a metal film made of a Ni—Cr alloy and a metal film made of Cu are laminated on a long resin film, but metal films to be formed are not limited thereto and may be an oxide film, a nitride film, a carbide film, and the like.

The vacuum deposition apparatus has been described above as one specific example of the roll-to-roll type treatment apparatus for a long base material according to the present invention, but the treatment apparatus for a long base material according to the present invention is not limited thereto, and it can be an apparatus to modify the surface of the long base material by performing a process such as plasma treatment or ion beam treatment that applies a thermal load to the long base material in a vacuum chamber under a reduced-pressure atmosphere. It is to be noted that a plasma treatment performs a treatment of a long base material by, for example, oxygen plasma or nitrogen plasma generated by electric discharge in a mixed gas of argon and oxygen or a mixed gas of argon and nitrogen under a reduced-pressure atmosphere, and an ion beam treatment is generates plasma discharge in a magnetic field gap to which a strong magnetic field is applied under a reduced-pressure atmosphere, and an object (long base material) is irradiated with ion beams generated by anodically electrolyzing positive ions in the plasma.

EXAMPLES

Examples

Deposition was performed on one or both surfaces of a long resin film F with the use of the vacuum deposition apparatus (sputtering web coater) shown in FIG. 1. As the long resin film F, a PET film "COSMOSHINE (registered trademark)" having a width of 570 mm, a length of 1000 m, and a thickness of 50 μm manufactured by Toyobo Co., Ltd. was used. Two cylindrical members made of stainless steel and having a diameter of 800 mm and a width of 800 mm were used for the can rolls 17 and 23, and their outer circumferences were plated with hard chromium.

(Deposition on Both Surfaces by Roll-to-Roll Transfer in One Direction)

A metal layer deposited on the PET film was a laminated layer composed of a Ni—Cr film as a seed layer and a Cu film formed thereon. Therefore, Ni—Cr targets were mounted on the first magnetron sputtering cathode 41 located around the first can roll 17 and the sixth magnetron sputtering cathode 46 located around the second can roll 23, and Cu targets were mounted on the other 6 magnetron sputtering cathodes.

The PET film was loaded on the unwinding roll 11, and its leading end was drawn and attached to the winding roll 27 in such a manner that the PET film was passed through the first can roll 17 and the path A located on the lower side of the second can roll 23. The tension of the PET film unwound from the unwinding roll 11 and wound up on the winding roll 27 was set to 100 N, and the tension of the PET film before and after the first can roll 17 and the tension of the PET film before and after the second can roll 23 were both set to 200 N. The vacuum chamber was evacuated to 5 Pa using two or more dry pumps, and then evacuated to $3\times10^{-3}$ Pa using two or more turbomolecular pumps and cryocoils.

In this state, a Ni—Cr film as a seed layer and a Cu film laminated thereon were deposited by introducing 300 sccm of argon gas into each of the magnetron sputtering cathodes and controlling electric power applied to each of the cathodes at 20 kW while the PET film was transferred at a transfer speed of 4 m/min. As a result, a Ni—Cr film having a film thickness of 30 nm and a Cu film having a film thickness of 90 nm laminated thereon could be formed on each of both the surfaces of the PET film.

(Deposition on Only One Surface by Film Transfer in One Direction)

The PET film was passed through the upper path B instead of the lower path A to perform deposition on only one surface of the PET film, a laminated layer composed of a Ni—Cr film as a seed layer and a Cu film formed thereon. At this time, the laminated layer was formed in the same manner as in the above-described case where deposition was performed on both surfaces of the PET film except that Ni—Cr targets were mounted on the first and second magnetron sputtering cathodes 41 and 42 located around the first can roll 17 and Cu targets were mounted on the other 6 magnetron sputtering cathodes and that the transfer speed of the PET film was changed to 8 m/min. As a result, a Ni—Cr film having a film thickness of 30 nm and a Cu film having a film thickness of 90 nm laminated thereon could be formed on one surface of the PET film at a transfer speed two times as fast as that when deposition was performed on both surfaces of the PET film.

Comparative Example 1

Figure 2:
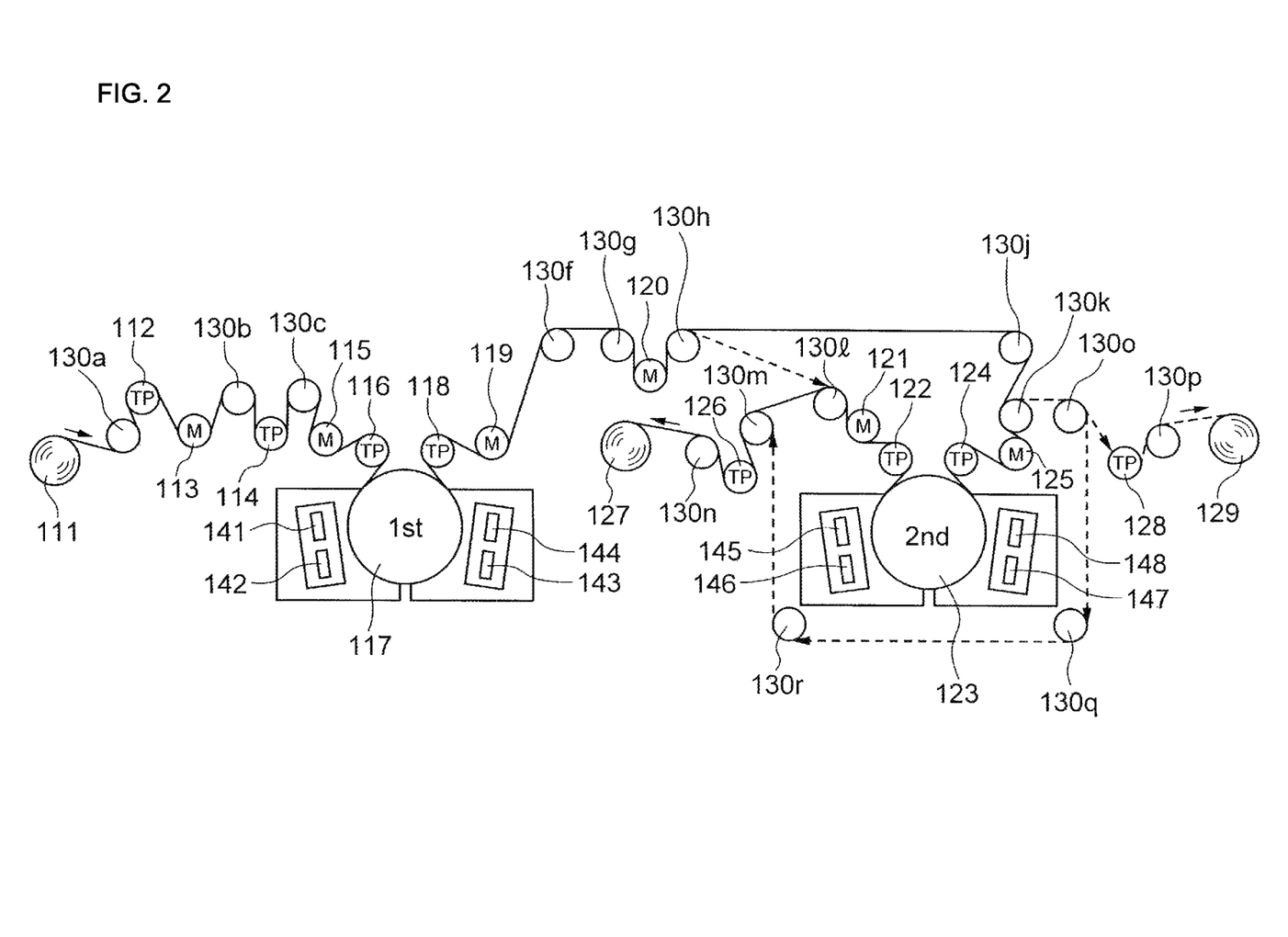
FIG. 2 A front view of a roll-to-roll type vacuum deposition apparatus of Reference Example 1 which is capable of selecting either a path for double-side deposition or a path for single-side deposition.

Deposition was performed on one or both surfaces of a long resin film F with the use of a vacuum deposition apparatus shown in FIG. 2 having two can rolls. In the vacuum deposition apparatus shown in FIG. 2, the first half of a roll-to-roll transfer path, in which deposition is performed on the long resin film F wound around the outer circumference of a first can roll 117, has the same configuration as the above-described vacuum deposition apparatus shown in FIG. 1. More specifically, the long resin film F unwound from an unwinding roll 111 is passed through a free roll 130*a*, a first tension sensor roll 112, a first driving roll 113, a free roll 130*b*, a second tension sensor roll 114, a free roll 130*c*, a first feeding roll 115, and a first feeding tension sensor roll 116 in this order and fed to the first can roll 117 so that deposition is performed by deposition means on the long resin film F transferred along the outer circumference of the first can roll 117, and then the long resin film F is sent from the outer circumference of the first can roll 117 through a first sending tension sensor roll 118 by a first sending roll 119.

The second half of the roll-to-roll transfer path, in which deposition is performed on the long resin film F wound around the outer circumference of a second can roll 123, is different from that shown in FIG. 1. More specifically, in the second half of the roll-to-roll transfer path shown in FIG. 2, the long resin film F sent from the first sending roll 119 is passed through free rolls 130*f* and 130*g* and a central driving roll 120 located at almost the center of the roll-to-roll transfer path, and is then sent to a branching free roll 130*h* that serves as a branching point of the path. By this branching free roll 130*h*, the long resin film F is sent to either a path A indicated by a solid line or a path B indicated by a broken line. The path A indicated by a solid line is a path in which the long resin film F is wound around the outer circumference of the second can roll 123 in a counterclockwise manner. In the case of the path A, deposition can be performed on both surfaces of the long resin film F by roll-to-roll transfer in one direction. On the other hand, the path B indicated by a broken line is a path in which the long resin film F is wound around the outer circumference of the second can roll 123 in a clockwise manner. In the case of the path B, deposition is performed on only one surface of the long resin film F by roll-to-roll transfer in one direction.

More specifically, in the path A indicated by a solid line, the long resin film F sent from the free roll 130*h* is passed through free rolls 130*j* and 130*k*, and is then, similarly to the feeding and sending system for the first can roll 117, fed to the second can roll 123 by a right driving roll 125 and a right tension sensor roll 124 so that deposition is performed by deposition means on the long resin film F transferred along the outer circumference of the second can roll 123, and then the long resin film F is sent from the outer circumference of the second can roll 123 by a left tension sensor roll 122 and a left driving roll 121, passed through free rolls 130*l* and 130*m*, a first pre-winding tension sensor roll 126, and a free roll 130*n*, and directly wound up on a first winding roll 127.

On the other hand, in the path B indicated by a broken line, the long resin film F travels through the feeding and sending system described above with reference to the path A in a direction opposite to that in which the long resin film F travels through the path A, and is then, unlike the path A, wound up on a second winding roll 129. More specifically, the long resin film F sent from the free roll 130*h* is passed through the free roll 130*l*, and is then fed to the second can roll 123 by the left driving roll 121 and the left tension sensor roll 122 so that deposition is performed by deposition means on the long resin film F transferred along the outer circumference of the second can roll 123 in a direction opposite to that in which the long resin film F is transferred through the path A. Then, the long resin film F is sent from the outer circumference of the second can roll 123 by the right tension sensor roll 124 and the right driving roll 125, passed through free rolls 130*k* and 130*o*, a second pre-winding tension sensor roll 128, and a free roll 130*p*, and wound up on the second winding roll 129. It is to be noted that the long resin film F that has been subjected to a deposition process through the path B may be wound up on the first winding roll 127, in which case the long resin film F sent from the free roll 130*o* is sent to the first pre-winding tension sensor roll 126 through the free rolls 130*q*, 130*r*, and 130*m*.

When a Ni—Cr film as a seed layer and a Cu film laminated thereon are deposited on each of both the surfaces of the long resin film F by roll-to-roll transfer in one direction in the vacuum deposition apparatus shown in FIG. 2, deposition can be performed in the same manner as in Example by mounting Ni—Cr targets on a first magnetron sputtering cathode 141 located around the first can roll 117 and an eighth magnetron sputtering cathode 148 located around the second can roll 123 and mounting Cu targets on the other 6 magnetron sputtering cathodes. On the other hand, when a Ni—Cr film as a seed layer and a Cu film laminated thereon are deposited on only one surface of the long resin film F by film transfer in one direction, deposition can be performed in the same manner as in Example by mounting Ni—Cr targets on the first magnetron sputtering cathode 141 and a second magnetron sputtering cathode 142 located around the first can roll 117 and mounting Cu targets on the other 6 magnetron sputtering cathodes.

However, the transfer path between the free roll 130*h* and the free roll 130*j* crosses the second can roll 123, and therefore a problem with transfer, such as sagging of the long resin film F, is likely to occur. In addition, the space for installing the vacuum deposition apparatus needs to be increased due to the upsizing of a vacuum chamber. In particular, the treatment apparatus for a long base material is installed in a clean room, and therefore peripheral equipment of the clean room, such as air-conditioning equipment, is upsized, which leads to an increase in cost. Further, the atmosphere in the upsized vacuum chamber needs to be maintained at a predetermined reduced pressure, and therefore the mechanical strength of the vacuum chamber may need to be increased.

The above problem with transfer may be prevented by further providing a free roll between the free roll 130*h* and the free roll 130*j*, which, however, leads to an increase in cost and requires extra maintenance. Further, since the first winding roll 127 is provided between the first can roll 117 and the second can roll 123, it takes effort not only to unload the long resin film F after deposition from the first winding roll 127 but also to attach the leading end of the long resin film F to the first winding roll 127 before deposition. Therefore, it cannot be said that this apparatus is excellent in maintainability.

It is to be noted that the first winding roll 127 may be omitted by winding up the long resin film F, sent from the free roll 103*l*, on the second winding roll 129, in which case the long resin film F sent from the free roll 130*l* after deposition on both surfaces of the long resin film F through the path A is passed through the free rolls 130*r*, 130*q*, and 130*o*, the second pre-winding tension sensor roll 128, and the free roll 130*p* and wound up on the second winding roll 129. In this case, however, the long resin film F crosses the second can roll 123 not only between the free roll 130*h* and the free roll 130*j* but also between the free roll 130*r* and the free roll 130*q*, which causes the above-described problem with transfer or problem with maintenance.

Comparative Example 2

Figure 3:
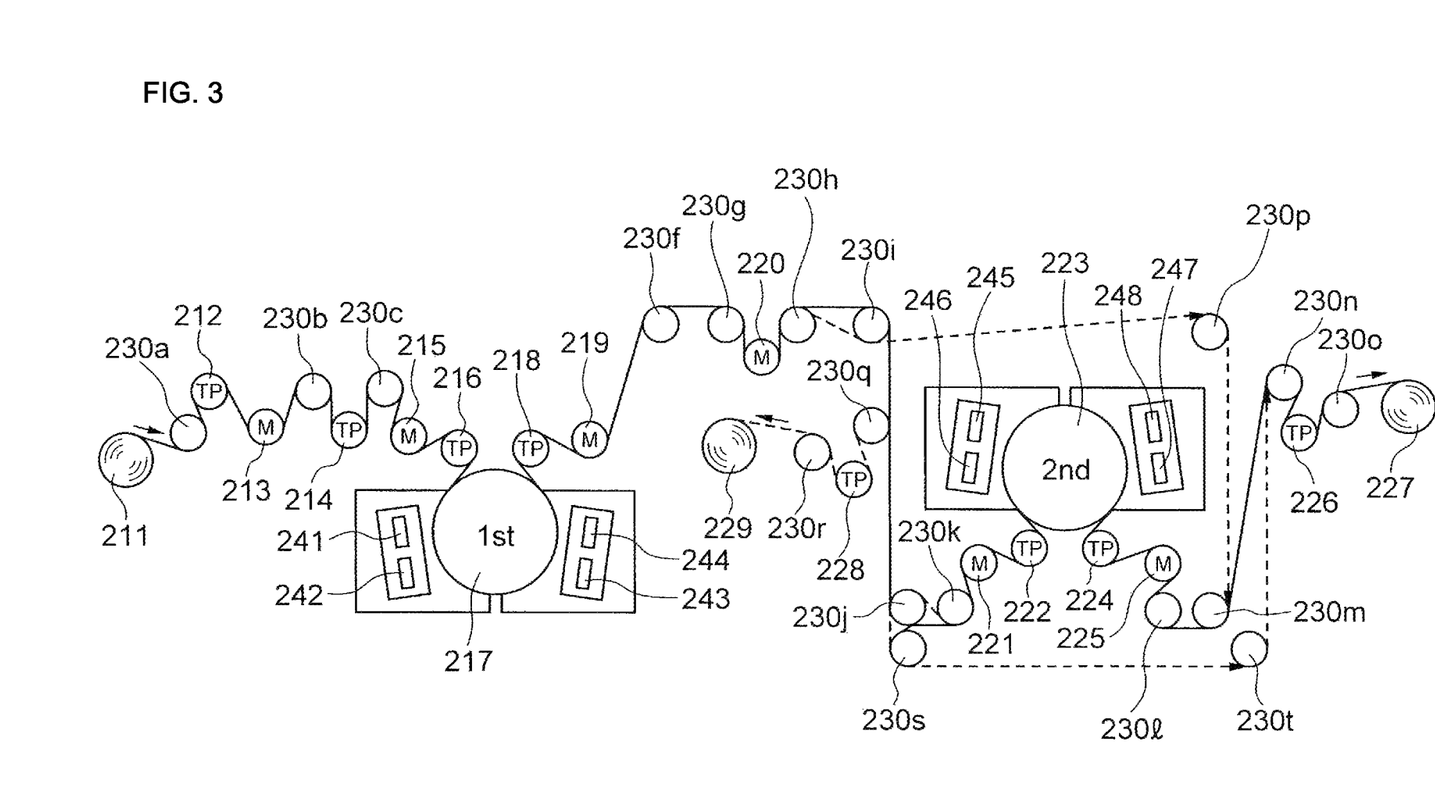
FIG. 3 A front view of a roll-to-roll type vacuum deposition apparatus of Reference Example 2 which is capable of selecting either a path for double-side deposition or a path for single-side deposition.

Deposition was performed on one or both surfaces of a long resin film F with the use of a vacuum deposition apparatus shown in FIG. 3 having two can rolls. In the vacuum deposition apparatus shown in FIG. 3, the first half of a roll-to-roll transfer path, in which deposition is performed on the long resin film F wound around the outer circumference of a first can roll 217, has the same configuration as the above-described vacuum deposition apparatus shown in FIG. 1 or 2. More specifically, the long resin film F unwound from an unwinding roll 211 is passed through a free roll 230*a*, a first tension sensor roll 212, a first driving roll 213, a free roll 230*b*, a second tension sensor roll 214, a free roll 230*c*, a first feeding roll 215, and a first feeding tension sensor roll 216 in this order and fed to the first can roll 217 so that a deposition process is performed by deposition means on the long resin film F transferred along the outer circumference of the first can roll 217, and then the long resin film F is sent from the outer circumference of the first can roll 217 through a first sending tension sensor roll 218 by a first sending roll 219.

The second half of the roll-to-roll transfer path, in which deposition is performed on the long resin film F wound around the outer circumference of a second can roll 223 is different from that shown in FIG. 1 or 2. More specifically, in the second half of the roll-to-roll transfer path shown in FIG. 3, the long resin film F sent from the first sending roll 219 is passed through free rolls 230*f* and 230*g* and a central driving roll 220 located at almost the center of the roll-to-roll transfer path and then sent to a branching free roll 230*i* that serves as a branching point of the path. By this branching free roll 230*i*, the long resin film F is sent to either a path A indicated by a solid line or a path B indicated by a broken line. The path A indicated by a solid line is a path in which the long resin film F is wound around the outer circumference of the second can roll 223 in a clockwise manner. In the case of the path A, deposition can be performed on both surfaces of the long resin film F by roll-to-roll transfer in one direction. On the other hand, the path B indicated by a broken line is a path in which the long resin film F is wound around the outer circumference of the second can roll 223 in a counterclockwise manner. In the case of the path B, deposition is performed on only one surface of the long resin film F by roll-to-roll transfer in one direction.

More specifically, in the path A indicated by a solid line, the long resin film F sent from the free roll 230*i* is passed through free rolls 230*j* and 230*k*, and is then, similarly to the above-described feeding and sending system for the first can roll 217, fed to the second can roll 223 by a left driving roll 221 and a left tension sensor roll 222 so that a deposition process is performed by deposition means on the long resin film F transferred along the outer circumference of the second can roll 223, and then the long resin film F is sent from the outer circumference of the second can roll 223 by a right tension sensor roll 224 and a right driving roll 225, passed through free rolls 230*l*, 230*m*, and 230*n*, a first pre-winding tension sensor roll 226, and a free roll 230*o*, and directly wound up on a first winding roll 227.

On the other hand, in the path B indicated by a broken line, the long resin film F travels through the feeding and sending system described above with reference to the path A in a direction opposite to that in which the long resin film F travels through the path A, and is then, unlike the path A, wound up on a second winding roll 229. More specifically, the long resin film F sent from the free roll 230*i* is passed through a free roll 230*p* and the free rolls 230*m* and 230*l* and then fed to the second can roll 223 by the right driving roll 225 and the right tension sensor roll 224 so that a deposition process is performed by deposition means on the long resin film F transferred along the outer circumference of the second can roll 223 in a direction opposite to that in which the long resin film F is transferred through the path A, and then the long resin film F is sent from the outer circumference of the second can roll 223 by the left tension sensor roll 222 and the left driving roll 221, passed through the free rolls 230*k* and 230*j*, a free roll 230*q*, a second pre-winding tension sensor roll 228, and a free roll 230*r*, and wound up on the second winding roll 229. It is to be noted that when the long resin film F that has been subjected to a deposition process through the path B may be wound up on the first winding roll 227, in which case the long resin film F sent from the free roll 230*k* is wound around the free roll 230*j* in a counterclockwise manner, and is then sent to the first pre-winding tension sensor roll 226 through free rolls 230*s* and 230*t* and the free roll 230*n*.

When a Ni—Cr film as a seed layer and a Cu film laminated thereon are formed on each of both the surfaces of the long resin film F by roll-to-roll transfer in one direction in the vacuum deposition apparatus shown in FIG. 3, deposition can be performed in the same manner as in Example by mounting Ni—Cr targets on a first magnetron sputtering cathode 241 located around the first can roll 217 and a sixth magnetron sputtering cathode 246 located around the second can roll 223 and mounting Cu targets on the other 6 magnetron sputtering cathodes. On the other hand, when a Ni—Cr film as a seed layer and a Cu film laminated thereon are formed on only one surface of the long resin film F by film transfer in one direction, deposition can be performed in the same manner as in Example by mounting Ni—Cr targets on the first magnetron sputtering cathode 241 and a second magnetron sputtering cathode 242 located around the first can roll 217 and mounting Cu targets on the other 6 magnetron sputtering cathodes.

However, the transfer path between the free roll 230*i* and the free roll 230*p* crosses the second can roll 223, which causes, as in the case of Comparative Example 1 described above, a problem with transfer, such as sagging of the long resin film F, or a problem of upsizing of a vacuum chamber. Further, the second winding roll 229 is provided between the first can roll 217 and the second can roll 223, which also causes a problem of workability or maintainability.

It is to be noted that the first winding roll 227 of the apparatus shown in FIG. 3 may also be omitted by winding up the long resin film F, sent from the free roll 230*l*, on the second winding roll 229, in which case the long resin film F sent from the free roll 230*l* after deposition is performed on both surfaces of the long resin film F through the path A is passed through the free rolls 230*s* and 230*q*, the second pre-winding tension sensor roll 228, and the free roll 230*r*, and wound up on the second winding roll 229. In this case, however, the long resin film F crosses the second can roll 223 not only between the free roll 230*i* and the free roll 230*p* but also between the free roll 230*l* and the free roll 230*s*, which causes the above-described problem with transfer or problem with maintenance.

EXPLANATION OF REFERENCES

F Long resin film
11 Unwinding roll
12 First tension sensor roll
13 First driving roll
14 Second tension sensor roll
15 First feeding roll
16 First feeding tension sensor roll
17 First can roll
18 First sending tension sensor roll
19 First sending roll
20 Central driving roll
21A, 21B Lower feeding rolls
22A, 22B Lower feeding tension sensor rolls
23 Second can roll
24A, 24B Lower sending tension sensor rolls
25A, 25B Lower sending rolls
26 Pre-winding tension sensor roll
27 Winding roll
30*a*, 30*b*, 30*c*, 30*d*, 30*e*, 30*f*, 30*g*, 30*h*, 30*i*, 30*j$_A$*, 30*j$_B$*, 30*k$_A$*, 30*k$_B$*, 30*l$_A$*, 30*l$_B$*, 30*m$_A$*, 30*m$_B$*, 30*n*, 30*o* Free rolls
41, 42, 43, 44, 45, 46, 47, 48 Magnetron sputtering cathodes
111, 211 Unwinding rolls
112, 212 First tension sensor rolls
113, 213 First driving rolls
114, 214 Second tension sensor rolls
115, 215 First feeding rolls
116, 216 First feeding tension sensor rolls
117, 217 First can rolls
118, 218 First sending tension sensor rolls
119, 219 First sending rolls
120, 220 Central driving rolls
121, 221 Left driving rolls
122, 222 Left tension sensor rolls
123, 223 Second can rolls
124, 224 Right tension sensor rolls
125, 225 Right driving rolls
126, 226 First pre-winding tension sensor rolls
127, 227 First winding rolls
128, 228 Second pre-winding tension sensor rolls
129, 229 Second winding rolls
130*a*, 130*b*, 130*c*, 130*f*, 130*g*, 130*h*, 130*j*, 130*k*, 130*l*, 130*m*, 130*n*, 130*o*, 130*p*, 130*q*, 130*r* Free rolls
141, 142, 143, 144, 145, 146, 147, 148 Magnetron sputtering cathodes
230*a*, 230*b*, 230*c*, 230*f*, 230*g*, 230*h*, 230*i*, 230*j*, 230*k*, 230*l*, 230*m*, 230*n*, 230*o*, 230*p*, 230*q*, 230*r*, 230*s*, 230*t* Free rolls
241, 242, 243, 244, 245, 246, 247, 248 Magnetron sputtering cathodes

The invention claimed is:

1. A roll-to-roll treatment apparatus comprising: at least two can rolls provided on a transfer path through which a long base material is transferred from an unwinding roll to a single winding roll in a roll-to-roll manner in a vacuum chamber; and surface treatment means facing an outer circumference of each of the can rolls to treat a surface of the long base material cooled by being wound around the outer circumference, wherein at least one of the at least two can rolls is provided with a first set and a second set of feeding and sending systems having a function of winding the long base material around an outer circumference of the can roll, and one surface of the long base material in contact with the outer circumference of the corresponding can roll at a time when the long base material travels through one of the first set and the second set of feeding and sending systems is opposite to the other surface of the long base material in contact with the outer circumference of the corresponding can roll at a time when the long base material travels through another set of feeding and sending system, wherein the first set of feeding and sending system contains a first feeding roll, a first feeding tension sensor roll, a first sending tension sensor roll, and a first sending roll, and the second set of feeding and sending system contains a second feeding roll, a second feeding tension sensor roll, a second sending tension sensor roll, and a second sending roll, wherein a central driving roll is located on the transfer path between the at least two can rolls, and wherein the first set and the second set of feeding and sending systems are provided on upper and lower sides of a horizontal plane, respectively, having thereon a rotation center axis of the corresponding can roll, respectively so as to be symmetry with respect to the horizontal plane so that the long base material is always wound up on the single winding roll after traveling through either the first set or the second set of feeding and sending systems.

2. The processing apparatus according to claim 1, wherein the unwinding roll and the single winding roll are provided at one end and another end of the treatment apparatus, respectively.

3. The roll-to-roll treatment apparatus according to claim 1, wherein the long base material is transferred while its width direction is kept substantially horizontal.

4. The roll-to-roll treatment apparatus according to claim 1, wherein the surface treatment means is a dry plating unit.

5. The roll-to-roll treatment apparatus according to claim 4, wherein the dry plating means is a sputtering cathode.

6. The roll-to-roll treatment apparatus according to claim 1, wherein the at least two can rolls include an upstream first can roll and a downstream second can roll, the can roll provided with the first set and the second set of feeding and sending systems corresponds to the second can roll, the first can roll is provided with a feeding and sending system on only upper or lower side of a plane having thereon a central axis of the first can roll, and when the long base material is transferred through one of the first set and the second set of feeding and sending systems of which positional relationship to the second can roll is different from that of the feeding and sending system, provided on the upper or lower side of the first can roll, to the first can roll, processing is performed on both surfaces of the long base material by roll-to-roll transfer in one direction, and when the long base material is transferred through one of the first set and the second set of feeding and sending systems of which positional relationship to the second can roll is the same as that of the feeding and sending system, provided on the upper or lower side of the first can roll, to the first can roll, processing is performed on only one surface of the long base material by roll-to-roll transfer in one direction.

7. The processing apparatus according to claim 6, wherein the unwinding roll and the single winding roll are provided at one end and another end of the treatment apparatus, respectively.

8. The roll-to-roll treatment apparatus according to claim 6, wherein the long base material is transferred while its width direction is kept substantially horizontal.

9. The roll-to-roll treatment apparatus according to claim 6, wherein the surface treatment means is a dry plating unit.

\* \* \* \* \*